United States Patent

[11] 3,569,842

[72] Inventor John R. Schroyer
Cincinnati, Ohio

[21] Appl. No. 748,445
[22] Filed July 29, 1968
[45] Patented Mar. 9, 1971
[73] Assignee The Bendix Corporation

[54] PULSE DELAY CIRCUIT
7 Claims, 2 Drawing Figs.

[52] U.S. Cl. .......... 328/55, 307/228, 307/293, 328/149, 328/181
[51] Int. Cl. .......... H03k 5/159
[50] Field of Search .......... 307/228, 260, 262, 264, 265, 286, 293; 328/129, 55, 146, 147, 181—185

[56] References Cited
UNITED STATES PATENTS
3,297,883 1/1967 Schulmeyer et al. .......... 307/228
3,484,624 12/1969 Rasiel et al. .......... 307/265

*Primary Examiner*—Stanley D. Miller, Jr.
*Attorneys*—Smith, Thompson and Raymond J. Eifler

ABSTRACT: This disclosure describes an electronic solid state pulse delay circuit for producing an output pulse a predetermined time after the application of an input triggering pulse by having the input trigger pulse directly initiate the generation of a ramp voltage and simultaneously trigger a bistable device the function of which is to continue the generation of the ramp voltage after the cessation of the input signal.

PATENTED MAR 9 1971 3,569,842

INVENTOR.
JOHN R. SCHROYER

BY Eugene C Goodale

ATTORNEY

PULSE DELAY CIRCUIT

FIELD OF THE INVENTION

This invention relates to a pulse forming circuit and more particularly to a unique electronic solid state pulse delay circuit.

DESCRIPTION OF THE PRIOR ART

Numerous delay circuits have been developed in the past which are able to produce pulses a given time after the introduction of a pulse to the circuit. These circuits have been characterized by a multitude of components, high costs and moderate circuit stability. The present invention uses a minimum of components, is low in cost and has a delay stability which exceeds that of other more complex delay circuits.

SUMMARY OF THE INVENTION

An electronic circuit is provided in which it is desired to produce an output pulse a predetermined time after the introduction of an input pulse. Commencing upon receipt of the input pulse, a portion of the circuit produces an almost linearly varying voltage signal which continues to increase with respect to time until that portion of the circuit is reset to the quiescent state. An independent signal generator provides a reference voltage signal of constant potential. Both signals are fed to a comparing device which will produce the desired output pulse only when the linearly varying voltage exceeds the reference voltage. Means are also provided to use the output pulse to disable or reset the linearly varying signal producing portion of the circuit so as to permit that portion to return to a zero potential condition.

DESCRIPTION OF THE DRAWING

An illustrative embodiment of the present invention is shown in the following drawings, in which.

DESCRIPTION OF THE PREFERRED EMBODIMENT

Figure 1:
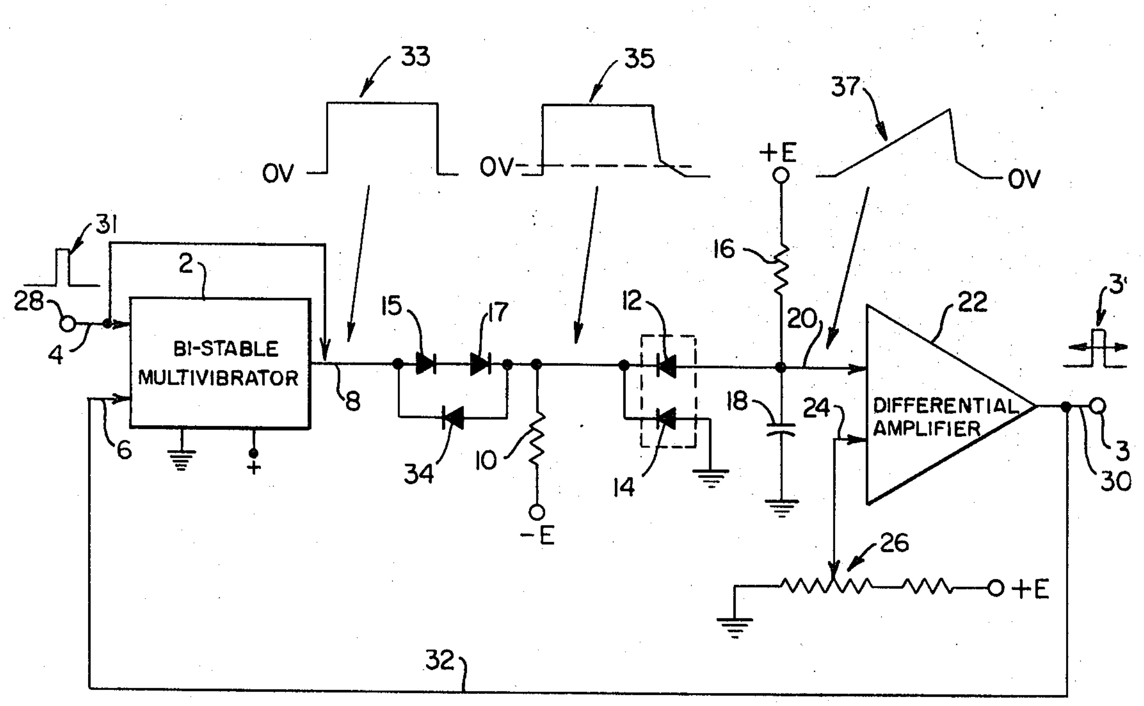
FIG. 1 is a circuit diagram of one embodiment of the invention, and FIG. 2 *a* through *e* is a diagrammatic representation of the waveforms generated in the delay circuit.

In the illustrative embodiment of the invention shown in FIG. 1, a bistable device 2, such as a bistable multivibrator, is provided in the circuit and transmits an output signal which depends upon the state of the bistable device. The multivibrator output line 8 is connected into the ramp generating portion of the circuit, which in turn connects into the differential amplifier 22 input lead 20. The second input lead 24 is connected to a delay potentiometer 26. Differential amplifier 22 only provides an output pulse signal 39 on lead 30 when the potential of the signal on the lead 20 exceeds the potential of the signal on lead 24. The differential amplifier output pulse also is used as a reset signal on lead 6 to the bistable multivibrator to cause it to switch states and thereby switch its signal on lead 8 a high potential to a low potential and thereby effectively turning off the circuit. A resistor 16–capacitor 18 voltage ramp generating network is interconnected in the circuit between the multivibrator and the lead 20 of amplifier 22. Effective discharge means which will be described in detail herebelow, are also interconnected in the circuit between the multivibrator and the differential amplifier for rapidly discharging the capacitor so as to decrease the recovery time of the circuit.

In the quiescent state, the output potential signal of the multivibrator 2 on line 8 is near ground (zero volts). Current from the power supplies flows through resistors 10 and 16 and diodes 12 and 14 while holding capacitor 18 at (or very near) zero volts. This condition exists because the voltage drops across diodes 12 and 14 are nearly equal. By the proper choice of resistor 10 and 16 values, the current through resistor 10 is twice that through resistor 16 when the voltage across capacitor 18 is zero. Thus, the current through resistor 10 divides equally between diodes 12 and 14. For maximum delay stability, diodes 12 and 14 should be thermally matched and encapsulated in a heat conductive material. With the multivibrator in the quiescent state or first condition, it is seen that diodes 12 and 14 allow current to pass. However, in a second condition, i.e. reverse biased as will be explained herebelow, diodes 12 and 14 are both nonconducting.

Diodes 15 and 17 are used in series to prevent any current flow from multivibrator 2 through resistor 10 during the quiescent state of the multivibrator. Hence, the series configuration insures that no current flow will pass to resistor 10 since it would be necessary to overcome two diode drops for current to flow.

Also, during the multivibrator quiescent state, the input signal over lead 20 to one input of differential amplifier 22 is zero volts which also corresponds to the capacitor 18 voltage. Lead 24 is connected at one end to the differential amplifier 22 second input and at the other end to the movable contact member of potentiometer 26. A signal having a positive voltage level, determined by the adjustment of potentiometer 26, is transmitted over lead 24 to the differential amplifier. Under these input signal conditions, i.e. a zero potential over lead 20 and a positive potential over lead 24, the output from differential amplifier 22 is negative. Potentiometer 26 receives its voltage from the same power supply that supplies capacitor 18 its charging current. It can be appreciated that this will greatly reduce a delay time variations associated with power supply voltage variations. It is desirable that the differential amplifier have a high gain, fast response, stable Δ E input specifications and low bias and leakage currents to the first and second inputs.

A pulse, represented by waveform 31, from triggering source 28 and transmitted over lead 4 will cause multivibrator 2 to change state and causes lead 8 to go to a positive voltage level as seen by waveform 33. Multivibrator 2 holds the high signal on lead 8 until the multivibrator is reset to the quiescent state. This signal reverse biases both diodes 12 and 14 so that the current through resistor 16 will now charge capacitor 18 in a positive direction with respect to time as shown by the upward slope of waveform 37. The +E voltage is high with respect to the maximum voltage that capacitor 18 charges to so the voltage ramp generated will be quite linear.

When the voltage potential across capacitor 18, which is also applied to the amplifier input connected to lead 20, reaches a level slightly more positive than the signal on lead 24, the amplifier will produce a positive output pulse 39 which is transmitted over lead 30 to a utilization element 36. The delayed output pulse 39 is also transmitted along reset line 32 to lead 6 which is connected to the second multivibrator input and thereby provides the reset pulse to switch the bistable multivibrator 2 back to the quiescent state. When the multivibrator 2 output signal falls back to ground, it discharges capacitor 18 most of the way to ground through diode 34 which decreases the recovery time of the circuit. Current through resistor 10 completely discharges capacitor 18. The delay circuit is now in the quiescent state again and ready for the application of the next input trigger pulse from triggering source 28.

Figure 2:
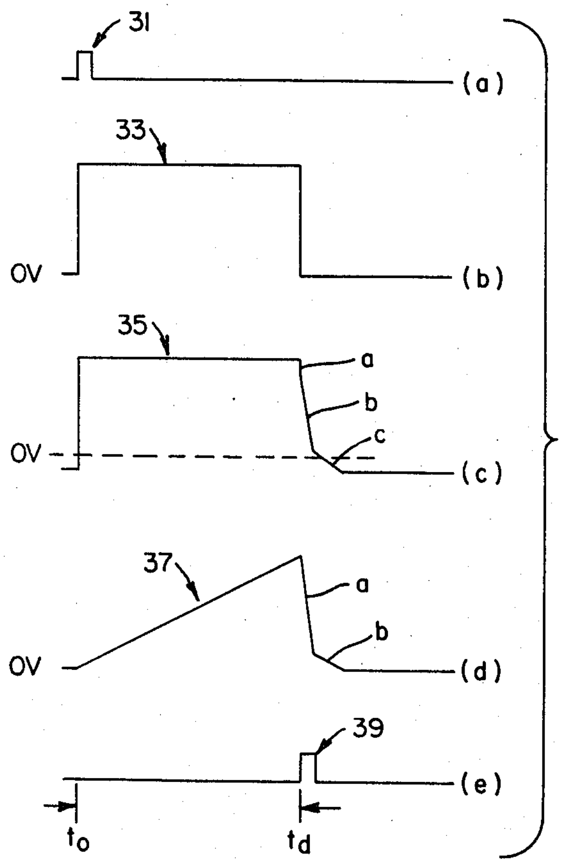

FIG. 2 shows a diagrammatic representation of the waveforms depicted in FIG. 1 with respect to time. At $t_o$ triggering pulse 31 occurs and the signals along the circuit represented by waveforms 33 and 35 go to a positive potential. Capacitor 18 will begin to charge as shown by waveform 37 until time $t_d$ at which point the potential of waveform 37 is more positive than the potential from the potentiometer and output pulse 39 is transmitted and also resets the multivibrator to its quiescent state.

It is seen that the waveform 35 discharges in three stages while waveform 37 discharges in two stages. The drop in potential resulting from the multivibrator switching states is indicated at 35*a*. As previously mentioned, capacitor 18 discharges most of the way to ground through diode 34 and is represented by slopes 35*b* and 37*a*. The capacitor is completely discharged through resistor 10 and is represented by slopes 35c and 37b.

It is seen that the time delay $t_d$ may be adjusted by potentiometer 26 and that the maximum time delay of the circuit is thus governed by the value of capacitor 18, the charging current through resistor 16, and the peak voltage that capacitor 18 will charge to.

While the form of apparatus herein described constitutes a preferred embodiment of the invention, it is to be understood that the invention is not limited to this precise form of apparatus.

I claim:

1. A pulse delay circuit for producing an output pulse a predetermined time after application of an input pulse comprising:
 - a source providing an input pulse;
 - a bistable device directly responsive to said input pulse to change its state and provide an output signal;
 - circuit means also directly responsive to said input pulse to initiate the generation of a linearly varying signal with respect to time commencing when said input pulse is directly received by the circuit means and responsive to the output signal of said bistable device for continuing its generation thereafter;
 - reference signal means providing a second signal having a constant reference potential; and
 - comparing means for comparing said linearly varying signal and said second signal and providing a delayed output signal when the potential of said linearly varying signal exceeds said second signal whereby the time delay of said output signal is determined by the time required for said first signal to exceed said second signal.

2. A pulse delay circuit for producing an output pulse a predetermined time after application of an input pulse comprising:
 - a source providing an input pulse;
 - a bistable device directly responsive to said input pulse to change its state and provide an output signal;
 - circuit means also directly responsive to said input pulse to initiate the generation of a linearly varying signal with respect to time commencing when said input pulse is directly received by the circuit means and responsive to the output signal of said bistable device for continuing its generation thereafter;
 - reference signal means providing a second signal having a constant reference potential;
 - comparing means for comparing said linearly varying signal and said second signal and providing a delayed output signal when the potential of said linearly varying signal exceeds said second signal whereby the time delay of said output signal is determined by the time required for said first signal to exceed said second signal; and
 - reset means responsive to said delayed output signal for restoring said bistable device to its original state and thus preparing the pulse delay circuit for receipt of a second input pulse.

3. A pulse delay circuit for producing an output pulse a predetermined time after application of an input pulse comprising:
 - a source providing an input pulse;
 - a bistable device directly responsive to said input pulse to change its state and provide an output signal;
 - circuit means also directly responsive to said input pulse to initiate the generation of a linearly varying signal with respect to time commencing when said input pulse is directly received by the circuit means and responsive to the output signal of said bistable device for continuing its generation thereafter;
 - reference signal means providing a second signal having a constant reference potential;
 - a common power supply for both said circuit means and said reference signal means whereby voltage variations in said power supply have no effect on time delay;
 - comparing means for comparing said linearly varying signal and said second signal and providing a delayed output signal when the potential of said linearly varying signal exceeds said second signal whereby the time delay of said output signal is determined by the time required for said first signal to exceed said second signal; and
 - reset means responsive to said delayed output signal for restoring said bistable device to its original state and thus preparing the pulse delay circuit for receipt of a second input pulse.

4. A pulse delay circuit comprising:
 - a source providing an input pulse;
 - a bistable multivibrator providing an output signal in response to said input signals thereto, said multivibrator including:
   - an output lead;
   - a first input directly responsive to an input trigger pulse for switching said multivibrator from a first state to a second state wherein a high potential output signal is transmitted therefrom in said second state;
   - a second input responsive to a reset pulse for switching said multivibrator from said second state to said first state wherein a low potential output signal is transmitted therefrom in said first state;
 - a differential amplifier providing a positive output pulse when the potential of a signal to a first input of said amplifier exceeds the potential of a signal to a second input thereof;
 - reference signal means connected to the second input of said amplifier providing a reference potential signal thereto;
 - circuit means between said multivibrator output and the first input of said amplifier and directly receiving said input trigger pulse to initiate a linearly varying signal with respect to time to said amplifier and to continue its generation in response to said multivibrator high potential output signal, whereby the continuing signal on the first input of said amplifier is dependent on the state of said multivibrator and the time delay of said output pulse is determined by the time required for said linearly varying signal to exceed said reference signal; and
 - means for applying the output pulse from said differential amplifier to the second input of said multivibrator to reset the delay circuit for the next operation.

5. A pulse delay circuit as set forth in claim 4 in which said circuit means further comprises a resistor and capacitor network operable between a positive power supply and ground to provide a relatively linearly increasing potential across said capacitor with respect to time, said network being connectable at a point between said resistor and capacitor to said circuit means between the first output of said amplifier and said multivibrator output whereby when the potential across said capacitor and applied to said amplifier first input exceeds the potential on said amplifier second input a positive pulse is transmitted from said differential amplifier and the time delay of said pulse delay circuit is governed by the value of said capacitor, the charging current through said resistor and the peak potential that said capacitor will reach.

6. A pulse delay circuit as set forth in claim 5 further comprising:
 - enabling means connected in said circuit means between said multivibrator output and said network connection point for disabling current flow in said circuit means between said multivibrator output and said network connection in response to said multivibrator second state output signal and for enabling current flow in response to said input pulse and to said multivibrator first state output signal;
 - a reset line connecting said differential amplifier output and said multivibrator second input whereby said amplifier output pulse provides the reset pulse for switching said multivibrator to its first state thereby enabling said enabling means for current flow therethrough whereby the level of said amplifier first input signal becomes less than said reference level signal and thereby prevents further transmission of amplifier positive output pulses; and discharge means providing a discharge path for said capacitor when said multivibrator output switches to the first state.

7. A pulse delay circuit comprising:

a source providing an input pulse;

a bistable multivibrator providing an output signal in response to said input signals thereto, said multivibrator including:

an output lead;

a first input directly responsive to an input trigger pulse for switching said multivibrator from a first state to a second state wherein a high potential output signal is transmitted therefrom in said second state; and a second input responsive to a reset pulse for switching said multivibrator from said second state to said first state wherein a low potential output signal is transmitted therefrom in said first state;

a differential amplifier providing a positive output pulse when the potential of a signal to a first input of said amplifier exceeds the potential of a signal to a second input thereof;

reference signal means connected to the second input of said amplifier providing a reference potential signal thereto;

circuit means between said multivibrator output and the first input of said amplifier and directly receiving said input trigger pulse to initiate a linearly varying signal with respect to time to said amplifier and to continue its generation in response to said multivibrator high potential output signal, whereby the continuing signal on the first input of said amplifier is dependent on the state of said multivibrator and the time delay of said output pulse is determined by the time required for said linearly varying signal to exceed said reference signal;

means for applying the output pulse from said differential amplifier to the second input of said multivibrator to reset the delay circuit for the next operation; and a common power supply for both the second input of said differential amplifier and for said reference signal means whereby voltage variations in said power supply have no effect on time delay.